United States Patent

Harris

(10) Patent No.: US 12,165,003 B2
(45) Date of Patent: Dec. 10, 2024

(54) SYSTEMS AND METHODS FOR IMPLEMENTING FINITE ELEMENT MODELLING

(71) Applicant: D-WAVE SYSTEMS INC., Burnaby (CA)

(72) Inventor: Richard G. Harris, Burnaby (CA)

(73) Assignee: D-WAVE SYSTEMS INC., Burnaby (CA)

(*) Notice: Subject to any disclaimer, the term of this patent is extended or adjusted under 35 U.S.C. 154(b) by 541 days.

(21) Appl. No.: 17/199,079

(22) Filed: Mar. 11, 2021

(65) Prior Publication Data

US 2021/0304050 A1 Sep. 30, 2021

Related U.S. Application Data

(60) Provisional application No. 63/000,052, filed on Mar. 26, 2020.

(51) Int. Cl.
*G06N 10/00* (2022.01)
*G06F 17/14* (2006.01)
(Continued)

(52) U.S. Cl.
CPC ............ *G06N 10/00* (2019.01); *G06F 17/14* (2013.01); *G06F 17/16* (2013.01); *G06F 30/23* (2020.01)

(58) Field of Classification Search
CPC ... G06N 10/00–80; G06F 17/11; G06F 17/14; G06F 17/16; G06F 17/18; G06F 30/23
See application file for complete search history.

(56) References Cited

U.S. PATENT DOCUMENTS 6,421,658 B1 7/2002 Carey et al.
6,665,863 B1 12/2003 Lord et al.
(Continued)

FOREIGN PATENT DOCUMENTS

WO 2004068300 A3 9/2005
WO 2005093649 A1 10/2005
(Continued)

OTHER PUBLICATIONS

P.C.S. Costa et al., Quantum algorithm for simulating the wave equation, Physical Review A 99, 012323, 2019 (Year: 2019).*
(Continued)

*Primary Examiner* — Emily E Larocque
(74) *Attorney, Agent, or Firm* — Cozen O'Connor

(57) ABSTRACT

A system and method of implementing finite element modeling on a quantum processor is discussed. A representation of a computational problem including a boundary value problem and problem grid points is received by one or more processors. The problem grid points are mapped to a Hilbert space of the qubits of the quantum processor. The boundary value problem is transformed into a problem Hamiltonian. Instructions are transmitted to the quantum processor to cause the quantum processor to evolve from an initial state to a final state based on the problem Hamiltonian. The wavefunction amplitudes of the final state are measured, and the wavefunction amplitudes of the final state are mapped onto the problem grid points based on the Hilbert space of the qubits.

14 Claims, 4 Drawing Sheets

(51) Int. Cl.
  *G06F 17/16* (2006.01)
  *G06F 30/23* (2020.01)

(56) References Cited

U.S. PATENT DOCUMENTS

| | | | |
|---|---|---|---|
| 6,838,694 | B2 | 1/2005 | Esteve et al. |
| 6,847,962 | B1 | 1/2005 | Cochrane et al. |
| 7,135,701 | B2 | 11/2006 | Amin et al. |
| 7,167,853 | B2 | 1/2007 | Zaharioudakis et al. |
| 7,177,798 | B2 | 2/2007 | Hsu et al. |
| 7,305,409 | B2 | 12/2007 | Lord et al. |
| 7,308,119 | B2 | 12/2007 | Gohda et al. |
| 7,335,909 | B2 | 2/2008 | Amin et al. |
| 7,392,264 | B2 | 6/2008 | Lord et al. |
| 7,418,283 | B2 | 8/2008 | Amin |
| 7,530,105 | B2 | 5/2009 | Gilbert et al. |
| 7,533,068 | B2 | 5/2009 | Maassen et al. |
| 7,565,627 | B2 | 7/2009 | Brill et al. |
| 7,619,437 | B2 | 11/2009 | Thom et al. |
| 7,624,088 | B2 | 11/2009 | Johnson et al. |
| 7,756,855 | B2 | 7/2010 | Ismalon |
| 7,870,087 | B2 | 1/2011 | MacReady et al. |
| 7,876,248 | B2 | 1/2011 | Berkley et al. |
| 7,984,012 | B2 | 7/2011 | Coury et al. |
| 8,073,808 | B2 | 12/2011 | Rose |
| 8,195,596 | B2 | 6/2012 | Rose et al. |
| 8,429,174 | B2 | 4/2013 | Ramani et al. |
| 10,204,305 | B2 | 2/2019 | Freedman et al. |
| 2003/0108242 | A1 | 6/2003 | Conant |
| 2005/0250651 | A1 | 11/2005 | Amin et al. |
| 2008/0238531 | A1 | 10/2008 | Harris |
| 2021/0304050 | A1 | 9/2021 | Harris |

FOREIGN PATENT DOCUMENTS

| | | |
|---|---|---|
| WO | 2006066415 A1 | 6/2006 |
| WO | 2007085074 A1 | 8/2007 |

OTHER PUBLICATIONS

A. Montanaro et al., Quantum algorithms and the finite element method, arXiv: 1512.05903v2 [quant-ph], 2016 (Year: 2016).*
"Homomorphic Encryption", MIT technology review, 2011.
"A High-Level Look at Optimization: Past, Present and Future," e-Optimization.Community, May 2000, pp. 1-5.
A. Strathearn et al, "Efficient non-Markovian Quantum Dynamics Using Time-evolving Matrix Product Operators", Nature Communications, 2018.
Allen et al., "Blue Gene: A vision for protein science using a petaflop supercomputer," IBM Systems Journal 40(2): 310-327, 2001.
Blatter et al., "Design aspects of superconducting-phase quantum bits," Physical Review B 63: 174511-1—174511-9, 2001.
Boros et al., "Local search heuristics for Quadratic Unconstrained Binary Optimization (QUBO)", Springer, Feb. 21, 2007.
Boyer et al., "On the Cutting Edge: Simplified O(n) Planarity by Edge Addition", Journal of Graph Algorithms and Applications, Jan. 2004.
Dolan et al., "Optimization on the NEOS Server," from SIAM News 35(6): 1-5, Jul./Aug. 2002.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Felzenzwalb & Huttenlocher, "Pictorial Structures for Object Recognition", Intl. Journal of Computer Visions 61(1), 55-79 (2005).
Feynman, "Simulating Physics with Computers," International Journal of Theoretical Physics 21(6/7): 467-488, 1982.
Fourer et al., "Optimization as an Internet Resource," Interfaces 31(2): 130-150, Mar.-Apr. 2001.
Friedman et al., "Quantum superposition of distinct macroscopic states," Nature 406:43-46, Jul. 6, 2000.
Gentry craig, "Computing arbitrary Functions of Encrypted data", Commun ACM 53(3):97-105, 2008.
Gilliam et al., "Foundational Patterns for Efficient Quantum Computing", arXiv:1907.11513 [quant-ph], Jul. 23, 2019.
Glover et al, "One pass heuristics for large scale unconstrained binary quadratic problems", University of Mississippi Technical Report HCES-09-00 (2000).
Goldberg et al, "Genetic algorithms with sharing for multimodal function optimization", Genetic algorithms and their applications: Proceedings of the Second International Conference on Genetic Algorithms, pp. 41{49. Hillsdale, NJ: Lawrence Erlbaum.
Grover, "A fast quantum mechanical algorithm for database search", Proceedings of the 28th Annual ACM Symposium on the Theory of Computing, pp. 212-219 (1996).
Gutwenger et al., "Graph Drawing Algorithm Engineering with AGD", Software Visualization, 2001.
H. Oshiyama et al, "Kibble-Zurek Mechanism in a Dissipative Transverse Ising Chain", Journal of the Physical Society of Japan 88, 2020.
Halperin et al, "Tag SNP selection in genotype data for maximizing SNP prediction accuracy", Bioinformatics, vol. 21 Suppl. 1 2005, pp. i195{i203. 2005.
Heckmann et al., "Optimal Embedding of Complete Binary Trees into Lines and Grids", Lecture Notes in in Computer Science 2269, 1991.
Il'ichev et al., "Continuous Monitoring of Rabi Oscillations in a Josephson Flux Qubit," Physical Review Letters 91(9): 097906-1—097906-4, week ending Aug. 29, 2003.
Ilievski, "Adiabatic Quantum Computation", Seminar, University of Ljubljana, Faculty for Mathematics and Physics, 2010, pp. 1-17, 2010.
Karp, "Reducibility Among Combinatorial Problems", R.E. Miller and J. W. Thatcher (eds). Complexity of Computer Computations. New York: Plenum. pp. 85103, (1972).
Knysh et al., "Adiabatic Quantum Computing in systems with constant inter-qubit couplings", arXiv:quant-ph/0511131, Nov. 15, 2005.
Kochenberger et al, "An Unconstrained Quadratic Binary Programming Approach to the Vertex Coloring Problem", Research partially supported by the Office of Naval Research Contract N00014-01-1-0917 in connection with the Hearin Center for Enterprise Science.
Lucas, "Ising formulations of many NP problems," Frontiers in Physics 2:Article 5, Feb. 12, 2014, 15 pages.
M. Mohseni, A. T. Rezakhani, and D. A. Lidar, "Quantum Process Tomography: Resource Analysis of Different Strategies", arXiv.org: 0702131, Mar. 19, 2008.
Mahfoud, "Niching methods for genetic algorithms.", Urbana, 51(95001):62{94, 1995.
Makhlin et al., "Quantum-state engineering with Josephson-junction devices," Reviews of Modern Physics 73 (2):357-400, Apr. 2001.
Montanaro et al, "Quantum Algorithms and the finite element method", arXiv, 2016.
Mooij et al., "Josephson Persistent-Current Qubit," Science 285:1036-1039, Aug. 13, 1999.
Nevo et al, "Genetic variation in nature", Scholarpedia, 6(7):8821., revision #91310, (2011).
Nielsen et al., Quantum Computation and Quantum Information, Cambridge University Press, Cambridge, 2000, "7.8 Other implementation schemes," pp. 343-345.
Orlando et al., "Superconducting persistent-current qubit," Physical Review B 60(22):15398-15413, Dec. 1, 1999.
Pelillo et al, "Matching Hierarchical Structures Using Association Graphs", IEEE Transactions on patter analysis and machine intelligence, vol. 21, No. 11, Nov. 1999.
Perdomo-Ortiz et al., "A Performance Estimator for Quantum Annealers: Gauge Selection and Parameter Setting.," arXiv:1503.01083v1 [quant-ph], Mar. 3, 2015, 10 pages.
S. Suzuki et al, "Quantum Annealing of Pure and Random Ising Chains Coupled to a Bosonic Environment", Journal of the Physical Society of Japan 88, 2019.
Sarah Michalak, " Leveraging LANLs D-Wave 2X for Random No. Generation", 2017.

(56) References Cited

OTHER PUBLICATIONS

Shields et al., "Area efficient layouts of binary trees in grids", ACM Digital Library, 2001.
Shirts et al., "Computing: Screen Savers of the Word Unite!," Science Online 290(5498): 1903-1904, Dec. 8, 2000.
Shor, "Introduction to Quantum Algorithms," AT&T Labs—Research, arXiv:quant-ph/0005003 v2, pp. 1-17, Jul. 6, 2001.
Tamir R, "A Random Walk through Human Associations", Data Mining, Fifth IEEE International Conference on Digital Object Identifier, Jun. 27, 2005.
Wiskott et al, "Face Recognition by Elastic Bunch Graph Matching", IEEE Transactions on Pattern Analysis and Machine Intelligence, 19(7):775-779, 1997.
Wocjan et al., "Treating the Independent Set Problem by 2D Ising Interactions with Adiabatic Quantum Computing," arXiv:quant-ph/0302027v1, pp. 1-13, Feb. 4, 2003.
Ramos, et al., "Solving Mathematical Problems with Quantum Search Algorithm", arXiv.quant-ph/0605003, Year 2006, 16 pages.
Sundararaghaven, et al., "Solving differential equations on quantum computers" Multiscale Structural simulations laboratory, May 23, 2019, 45 pages.
Chamon, et al., "A superconducting circuit realization of combinatorial gauge symmetry", arXiv:2006.10060v1 [quant-ph] Jun. 17, 2020, 9 pages.
King, et al., "Qubit spin ice", arXiv:2007.10555v2 [quant-ph] Jul. 16, 2021, 18 pages.
King, et al., "Scaling advantage in quantum simulation of geometrically frustrated magnets", arXiv:1911.03446v1 [quant-ph] Nov. 8, 2019.
Neill, "A blueprint for demonstrating quantum supremacy with superconducting qubits", rXiv:1709.06678v1 [quant-ph] Sep. 19, 2017, 22 pages.
Bonderson et al, "Measurement-Only Topological Quantum Computation via Anyonic Interferometry" arXiv:0808.1933v2.
Burrello et al, "Braiding of non-aBelian Anyons Using Pairwise Interactions" arXiv:1210.5452v2, 2013.
Chamon et al, "Constructing Quantum Spin Liquids Using Combinatorial Gauge Symmetry", 2020.
Hart et al, "Correlations Induced By Fractional Statistics in Z2 Quantum Spin Liquids", arXiv:1911.06331v1, 2019.
Karzig et al, "Shortcuts To Nonabelian Braiding" arXiv:1501.02811v1, 2015.
King et al, "Quantum Artificial Spin Ice" arXiv:2007.10555v1, 2020.
Moore, Joel E., "Quasiparticles Do The Twist", 2009.
Sonnenschein et al, "Topological Spinon Bands and Vison Excitations in Spin-Orbit Coupled Quantum Spin Liquids", arXiv:1707.07306v1, 2017.
Zhou et al, "Experimental Realization of Spin Liquids in a Programmable Quantum Device",arXiv:2009.07853v2, 2020.

* cited by examiner

SYSTEMS AND METHODS FOR IMPLEMENTING FINITE ELEMENT MODELLING

FIELD

This disclosure generally relates to systems and methods for using quantum processors, and in particular, to systems and methods for performing finite element modelling using quantum processors.

BACKGROUND

Quantum Devices

Quantum devices are structures in which quantum mechanical effects are observable. Quantum devices include circuits in which current transport is dominated by quantum mechanical effects. Such devices include spintronics, and superconducting circuits. Both spin and superconductivity are quantum mechanical phenomena. Quantum devices can be used for measurement instruments, in computing machinery, and the like.

Quantum Processor

A quantum processor is a computing device that can harness quantum physical phenomena (such as superposition, entanglement, and quantum tunneling) unavailable to non-quantum devices. A quantum processor may take the form of a superconducting quantum processor. A superconducting quantum processor may include a number of superconducting qubits and associated local bias devices. A superconducting quantum processor may also include coupling devices (also known as couplers) that selectively provide communicative coupling between qubits.

Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

Quantum Computation

A quantum computer is a system that makes direct use of at least one quantum-mechanical phenomenon, such as, superposition, tunneling, and entanglement, to perform operations on data. The elements of a quantum computer are qubits. Quantum computers can provide speedup for certain classes of computational problems such as computational problems simulating quantum physics.

Hybrid Computing System Comprising a Quantum Processor

A hybrid computing system can include a digital computer communicatively coupled to an analog computer. In some implementations, the analog computer is a quantum computer and the digital computer is a classical computer.

The digital computer can include a digital processor that can be used to perform classical digital processing tasks described in the present systems and methods. The digital computer can include at least one system memory which can be used to store various sets of instructions, application programs, and/or data that are readable by a computer or processor.

The quantum computer can include a quantum processor that includes programmable elements such as qubits, couplers, and other devices. The qubits can be read out via a readout system, and the results communicated to the digital computer. The qubits and the couplers can be controlled by a qubit control system and a coupler control system, respectively. In some implementations, the qubit and the coupler control systems can be used to implement quantum annealing on the analog computer.

Superconducting Processor

A quantum processor may take the form of a superconducting processor. However, superconducting processors may include processors that are not intended for quantum computing. For instance, some implementations of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting "classical" processors. Due to their natural physical properties, superconducting classical processors may be capable of higher switching speeds and shorter computation times than non-superconducting processors, and it may be more practical to solve certain problems on superconducting classical processors.

Superconducting Qubits

Superconducting qubits are a type of superconducting quantum device that may be included in a superconducting integrated circuit. Superconducting qubits may be separated into several categories depending on the physical property used to encode information. For example, superconducting qubits may be separated into charge, flux, and phase devices. Charge devices store and manipulate information in the charge states of the device. Flux devices store and manipulate information in a variable related to the magnetic flux through some part of the device. Phase devices store and manipulate information in a variable related to the difference in superconducting phase between two regions of the device. Recently, hybrid devices using two or more of charge, flux and phase degrees of freedom have been developed. Superconducting qubits commonly include at least one Josephson junction. A Josephson junction is a small interruption in an otherwise continuous superconducting current path and is typically realized by a thin insulating barrier sandwiched between two superconducting electrodes. Thus, a Josephson junction may be formed as a three-layer or "trilayer" structure. Superconducting qubits are further described in, for example, U.S. Pat. Nos. 7,876,248, 8,035,540, and 8,098,179.

Quantum Annealing

Quantum annealing is a computational method that may be used to find a low-energy state of a system, typically preferably the ground state of the system. Similar in concept to classical simulated annealing, the method relies on the underlying principle that natural systems tend towards lower energy states, as lower energy states are more stable. While classical annealing uses classical thermal fluctuations to guide a system to a low-energy state, quantum annealing may use quantum effects, such as quantum tunneling, as a source of delocalization to reach an energy minimum more accurately and/or more quickly than classical annealing.

A quantum processor may be arranged to perform quantum annealing and/or adiabatic quantum computation. An evolution Hamiltonian can be constructed that is proportional to the sum of a first term proportional to a problem Hamiltonian and a second term proportional to a delocalization Hamiltonian, as follows:

$$H_E \propto A(t)H_P + B(t)H_D$$

where $H_E$ is the evolution Hamiltonian, $H_P$ is the problem Hamiltonian, $H_D$ is the delocalization Hamiltonian, and $A(t)$, B(t) are coefficients that can control the rate of evolution, and typically lie in the range [0,1].

In some implementations, a time-varying envelope function can be placed on the problem Hamiltonian. A suitable delocalization Hamiltonian is given by:

$$H_D \infty - \frac{1}{2} \sum_{i=1}^{N} \Delta_i \sigma_i^x$$

where N represents the number of qubits, $\sigma_i^x$ of is the Pauli x-matrix for the $i^{th}$ qubit and $\Delta_i$ is the single qubit tunnel splitting induced in the $i^{th}$ qubit. Here, the $\sigma_i^x$ terms are examples of "off-diagonal" terms.

A common problem Hamiltonian includes a first component proportional to diagonal single qubit terms and a second component proportional to diagonal multi-qubit terms, and may be of the following form:

$$H_P \infty - \frac{\varepsilon}{2} \left[ \sum_{i=1}^{N} h_i \sigma_i^z + \sum_{j>i}^{N} J_{ij} \sigma_i^z \sigma_j^z \right]$$

where N represents the number of qubits, $\sigma_i^z$ is the Pauli z-matrix for the $i^{th}$ qubit, $h_i$ and $J_{ij}$ are dimensionless local fields for the qubits, and couplings between qubits, and $\varepsilon$ is some characteristic energy scale for $H_P$. Here, the $\sigma_i^z$ and $\sigma_i^z \sigma_j^z$ terms are examples of "diagonal" terms. The former is a single qubit term and the latter is a two qubit term.

Throughout this specification, the terms "problem Hamiltonian" and "final Hamiltonian" are used interchangeably unless the context dictates otherwise. Certain states of the quantum processor are energetically preferred, or simply preferred, by the problem Hamiltonian. These include the ground states but may include excited states.

Hamiltonians such as $H_D$ and $H_P$ in the above two equations, respectively, may be physically realized in a variety of different ways. A particular example is realized by an implementation of superconducting qubits.

Finite Element Modelling

Finite element modelling is a numerical method for solving partial differential equations and is commonly used for solving problems of engineering and mathematical models. The method divides a mathematical model into non-overlapping components referred to as finite elements. These elements form a mesh having a finite number of nodes, which define the grid points for a given problem. The number of problem grid points will be determined by the density of the grid. The larger the elements selected, the less demanding the calculation. However, to obtain an accurate approximation, it is generally necessary to subdivide the considered space into a fine grid of elements.

For example, when considering solving a computational fluid dynamics (CFD) model known as Burgers' equation:

$$\partial_t u + u \partial_x u = v \partial_x^2 u$$

where u is a scalar field (such as density) and v represents viscosity, and:

$$\partial_t u = \partial u / \partial t, \partial_x u = \partial u / \partial x, \text{ and } \partial_x^2 u = \partial^2 u / \partial x^2.$$

This 1+1-dimensional system may be solved by sampling u(x,t) on a square grid in (x,t)-space. One can solve for the scalar field u at each point on the grid $u(x_i, t_j)$ to a desired number of bits of precision by determining the density of the grid. The nodes of this grid will provide the problem grid points. However, when solving Burgers' equation, the system is prone to shock wave formation, where u(x,t) can diverge. It is therefore necessary to sample u(x,t) on a very fine grid to avoid errant shockwave formation. This may generate high computational memory demands and may require significant time and/or computational resources for transferring data between processing units working on different parts of the problem. As such, techniques for solving this problem are limited by the memory capacity of the system.

For a general discussion of Finite Element Modelling, see, for example, Montanaro et al., QUANTUM ALGORITHMS AND THE FINITE ELEMENT METHOD, arxiv.org/pdf/1512.05903.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

According to an aspect, there is provided a method of operation of a hybrid computing system comprising a digital processor and a quantum processor, the quantum processor comprising qubits, the method being performed by the digital processor, the method implementing a finite element model, the method comprising receiving a representation of a computational problem, the computational problem comprising a boundary value problem and problem grid points, mapping the problem grid points to a Hilbert space of the qubits, transforming the boundary value problem into a problem Hamiltonian, transmitting instructions to the quantum processor to cause the quantum processor to evolve from an initial state to a final state based on the problem Hamiltonian, measuring the wavefunction amplitudes of the final state, and mapping the wavefunction amplitudes of the final state onto the problem grid points based on the Hilbert space of the qubits.

According to other aspects, transforming the boundary value problem into a problem Hamiltonian may comprise generating qubit bias and coupler values, transmitting instructions to the quantum processor to cause the quantum processor to evolve from an initial state to a final state based on the problem Hamiltonian may further comprise transmitting instructions to cause the quantum processor to evolve from an initial state to a final state based on the problem Hamiltonian and the qubit bias and coupler values, measuring the wavefunction amplitudes of the final state may comprise performing quantum process tomography, transmitting instructions to the quantum processor to cause the quantum processor to evolve from an initial state to a final state based on the problem Hamiltonian may comprise transmitting instructions that cause the quantum processor to evolve piecewise over a Feynman path integral from the initial state to the final state, transmitting instructions to the quantum processor to cause the quantum processor to evolve from an initial state to a final state based on the problem Hamiltonian may comprise transmitting instructions to the quantum processor to cause the quantum processor to evolve through quantum annealing from an initial Hamiltonian to the problem Hamiltonian, and mapping the problem grid points to a Hilbert space of the qubits may comprise determining all possible states of the qubits, defining a set of vectors, wherein each vector in the set of vectors represents one of the possible states of the qubits, and assigning each of the problem grid points to one of the vectors in the set of vectors.

According to an aspect, there is provided a hybrid computing system for implementing finite element modeling on a quantum processor, comprising a quantum processor comprising qubits, at least one non-transitory processor-readable medium that stores at least one of processor executable instructions and data, and at least one digital processor communicatively coupled to the least one non-transitory processor-readable medium and the quantum processor, wherein the at least one digital processor, in response to execution of the at least one of processor executable instructions and data receives a representation of a computational problem, the computational problem comprising a boundary value problem and problem grid points, maps the problem grid points to a Hilbert space of the qubits, transforms the boundary value problem into a problem Hamiltonian, transmits instructions to the quantum processor to cause the quantum processor to evolve from an initial state to a final state based on the problem Hamiltonian, measures the wavefunction amplitudes of the final state over the Hilbert space of the qubits, and maps the wavefunction amplitudes of the final state onto the problem grid points based on the Hilbert space of the qubits.

According to other aspects, the at least one digital processor may transform the boundary value problem into a problem Hamiltonian comprising qubit bias and coupler values, the at least one digital processor may transmit instructions to cause the quantum processor to evolve from an initial state to a final state based on the problem Hamiltonian and the qubit bias and coupler values, the at least one digital processor may measure the wavefunction amplitudes of the final state using quantum process tomography, the at least one digital processor may transmit instructions to the quantum processor to cause the quantum processor to evolve from an initial state to a final state based on the problem Hamiltonian by evolving piecewise over a Feynman path integral from the initial state to the final state, the at least one digital processor may transmit instructions to the quantum processor to cause the quantum processor to evolve from an initial state to a final state based on the problem Hamiltonian by performing quantum annealing from an initial Hamiltonian to the problem Hamiltonian, the at least one digital processor may map the problem grid points to a Hilbert space of the qubits by determining all possible states of the qubits, defining a set of vectors, wherein each vector in the set of vectors represents one of the possible states of the qubits, and assigning each of the problem grid points to one of the vectors in the set of vectors.

In other aspects, the features described above may be combined in any reasonable combination as will be recognized by those skilled in the art.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements and may have been solely selected for ease of recognition in the drawings.

DETAILED DESCRIPTION

Figure 1:
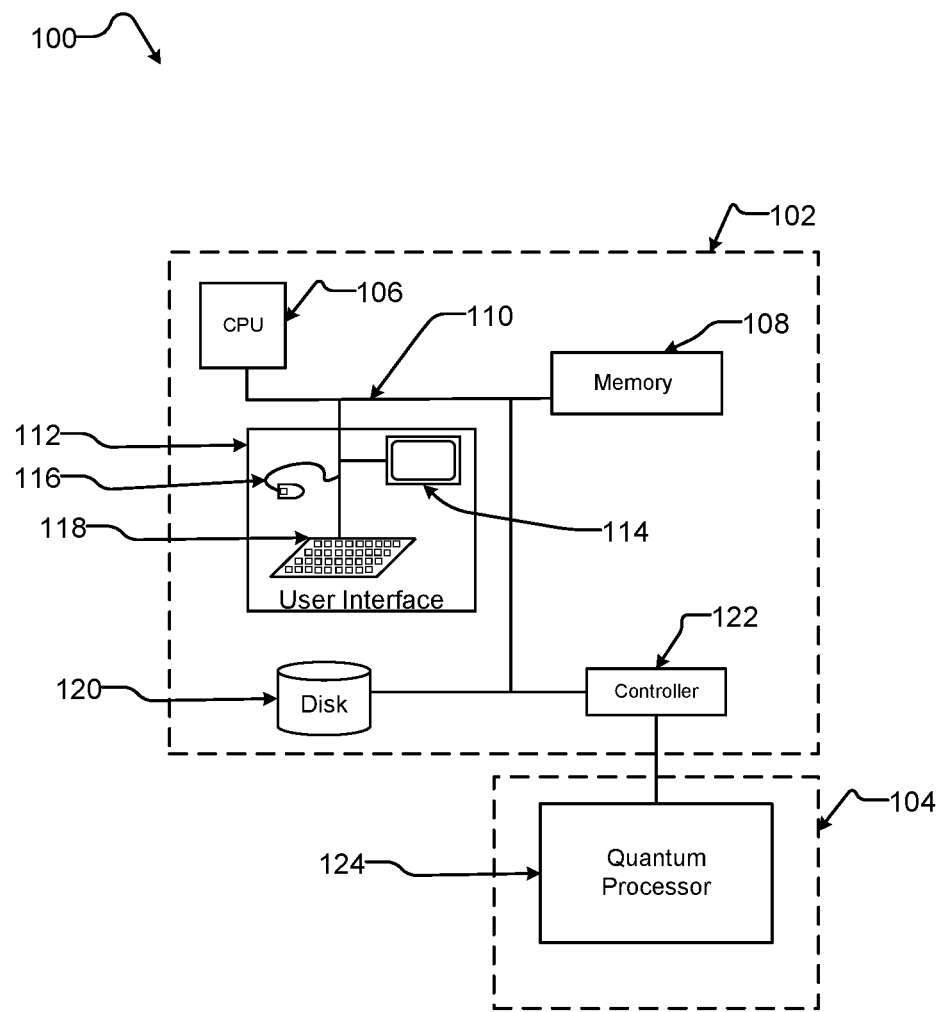
FIG. 1 is a schematic diagram of an example hybrid computing system comprising a quantum processor and a classical processor.

In the following description, certain specific details are set forth to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure, or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

As discussed above, Finite Element Modelling refers to a numerical method for solving partial differential equations that is commonly used for solving problems of engineering and mathematical models. As discussed herein, quantum memory may be employed to allow a fine grid of problem grid points to be mapped to a small number of qubits. Problem grid points are provided in finite element modelling by dividing a mathematical model into non-overlapping components referred to as finite elements in order to approximate the entire system. These finite elements form a mesh having a finite number of nodes, which define the problem grid points for a given problem. The number of problem grid points will be determined by the density of the grid and can be selected based on known properties of the system and the desired level of accuracy, or determined through iteratively selecting smaller elements and determining solutions. Mapping these problem grid points relative to the qubits of a quantum processor allows finite element modeling to be implemented on the quantum processor using quantum memory, as described in further detail below. Quantum memory is the storage of a quantum state for later retrieval. In the context of quantum computers, quantum states are stored in a register of qubits.

Referring to FIG. 1, a hybrid computing system 100 is illustrated, including a classical computer 102 coupled to a quantum computer 104. The example classical computer 102 includes a digital processor (CPU) 106 that may be used to perform classical digital processing tasks, and hence is denominated herein and in the claims as a classical processor.

Classical computer 102 may include at least one digital processor (such as central processor unit 106 with one or more cores), at least one system memory 108, and at least one system bus 110 that couples various system components, including system memory 108 to central processor unit 106. The digital processor may be any logic processing unit, such as one or more central processing units ("CPUs"), graphics processing units ("GPUs"), digital signal processors ("DSPs"), application-specific integrated circuits ("ASICs"), programmable gate arrays ("FPGAs"), programmable logic controllers (PLCs), etc.

Classical computer 102 may include a user input/output subsystem 112. In some implementations, the user input/output subsystem includes one or more user input/output components such as a display 114, mouse 116, and/or keyboard 118.

System bus 110 can employ any known bus structures or architectures, including a memory bus with a memory controller, a peripheral bus, and a local bus. System memory 108 may include non-volatile memory, such as read-only memory ("ROM"), static random-access memory ("SRAM"), Flash NANO; and volatile memory such as random access memory ("RAM") (not shown).

Classical computer 102 may also include other non-transitory computer or processor-readable storage media or non-volatile memory 120. Non-volatile memory 120 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 120 may communicate with the digital processor via system bus 110 and may include appropriate interfaces or controllers 122 coupled to system bus 110. Non-volatile memory 120 may serve as long-term storage for processor- or computer-readable instructions, data structures, or other data (sometimes called program modules) for classical computer 102.

Although classical computer 102 has been described as employing hard disks, optical disks and/or magnetic disks, those skilled in the relevant art will appreciate that other types of non-volatile computer-readable media may be employed, such magnetic cassettes, flash memory cards, Flash, ROMs, smart cards, etc. Those skilled in the relevant art will appreciate that some computer architectures employ volatile memory and non-volatile memory. For example, data in volatile memory can be cached to non-volatile memory, or a solid-state disk that employs integrated circuits to provide non-volatile memory.

Various processor- or computer-readable instructions, data structures, or other data can be stored in system memory 108. For example, system memory 108 may store instruction for communicating with remote clients and scheduling use of resources including resources on classical computer 102 and quantum computer 104. For example, the system memory 108 may store processor- or computer-readable instructions, data structures, or other data which, when executed by a processor or computer causes the processor(s) or computer(s) to execute one, more or all of the acts of the methods 200 (FIG. 2).

In some implementations system memory 108 may store processor- or computer-readable calculation instructions to perform pre-processing, co-processing, and post-processing to quantum computer 104. System memory 108 may store a set of quantum computer interface instructions to interact with the quantum computer 104.

Quantum computer 104 may include one or more quantum processors such as quantum processor 124. The quantum computer 104 can be provided in an isolated environment, for example, in an isolated environment that shields the internal elements of the quantum computer from heat, magnetic field, and other external noise (not shown). Quantum processor include programmable elements such as qubits, couplers, and other devices. In accordance with the present disclosure, a quantum processor, such as quantum processor 124, may be arranged to perform quantum annealing and/or adiabatic quantum computation. Example of quantum processor are described in U.S. Pat. No. 7,533,068.

Figure 2:
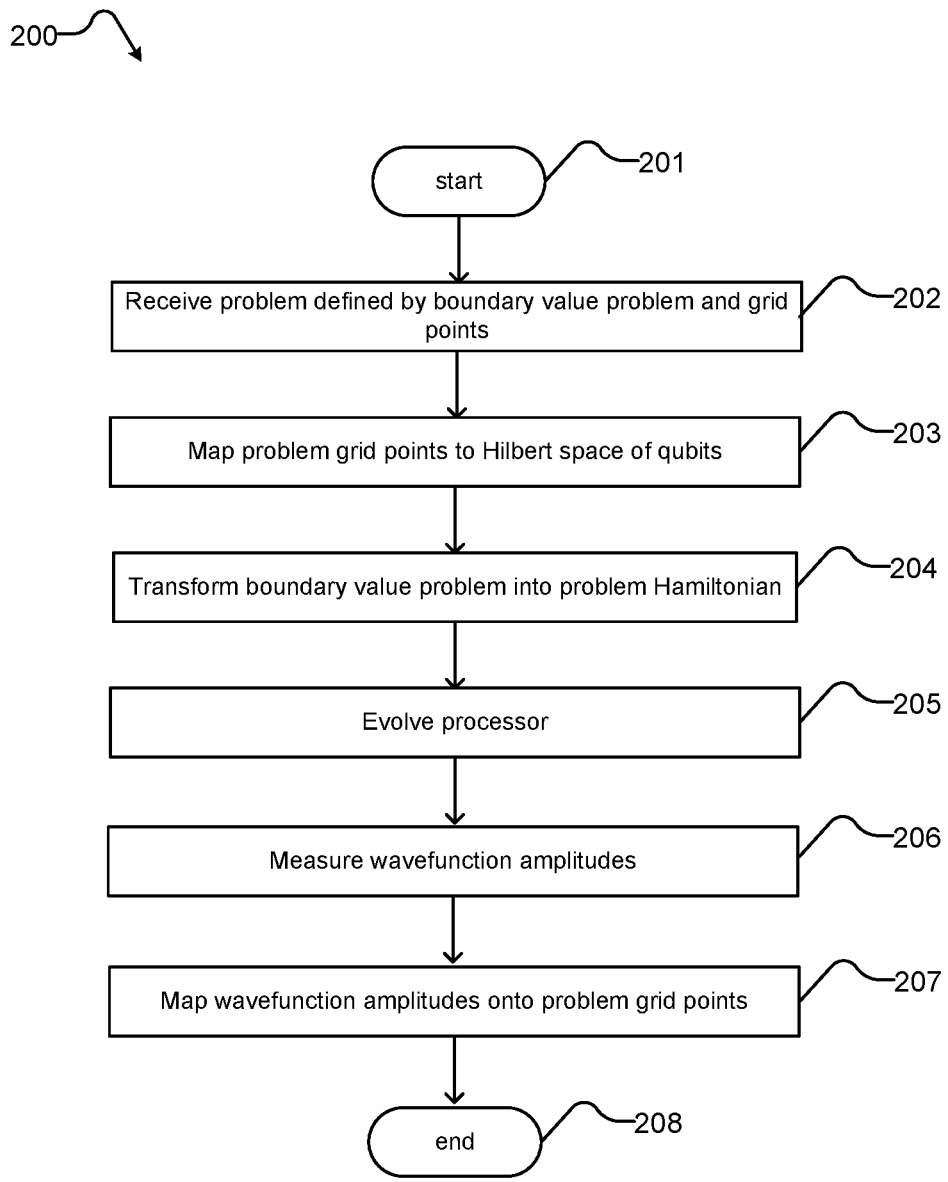
FIG. 2 is a flow diagram of an example method of implementing finite element modeling on a quantum processor.

FIG. 2 is a flow diagram of an example method 200 of implementing finite element modeling on a quantum processor. The quantum processor includes programmable elements as discussed above, including multiple qubits.

Method 200 comprises acts 201 to 208, however, a person skilled in the art will understand that the number of acts illustrated is an example, and, in some implementations, certain acts may be omitted, further acts may be added, and/or the order of the acts may be changed.

Method 200 starts at 201, for example in response to a call from another routine.

At 202, the digital processor receives a representation of a computational problem, including a boundary value problem and problem grid points. A boundary value problem is an equation or set of equations that hold within some finite region over which one wants to solve for a particular continuous variable, as well as a set of values that the continuous variable must take on the boundaries of that region. Typically, for finite element modelling, the boundary value problem will be a partial differential equation, or a set of partial differential equations. One example of such a boundary value problem is Burgers' equation, as discussed above. The boundary value problem is therefore defined by the equation or equations that define the system for which it is desired to perform finite element modelling, and the problem grid points are defined by the space over which it is desired to find solutions at the grid density determined to provide a sufficient solution.

At 203, the problem grid points are mapped to a Hilbert space of the qubits. The Hilbert space is a mathematical concept that refers to a multidimensional space within which certain operations can be performed. In the context of quantum computation, the Hilbert space is a vector space defined by vectors of all possible states of the quantum processor. For example, for a quantum system made up of three qubits, an orthonormal set of basis vectors that would span the Hilbert space of these three qubits would be:

{|000⟩,|001⟩,|010⟩,|100⟩,|101⟩,|011⟩,|110⟩,|111⟩}

Figure 3:
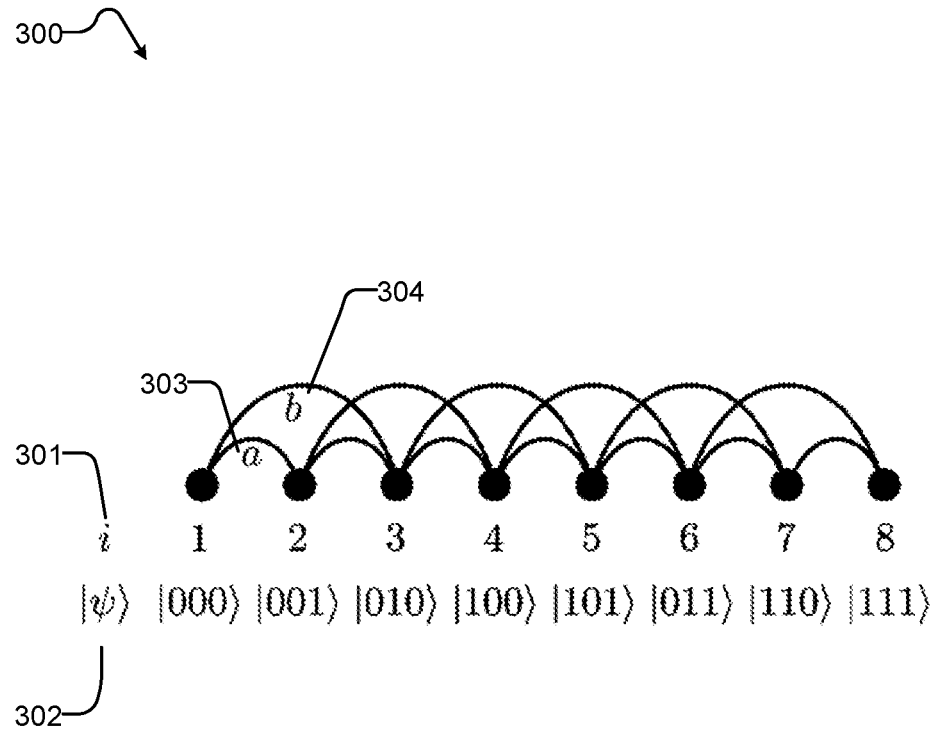
FIG. 3 is a representative diagram demonstrating the mapping of grid points to a Hilbert space and the elements of a wave function.

For this method, the Hilbert space of the qubits will be utilized such that each of these basis states will be assigned to one of the problem grid points. A 1:1 mapping of points in the problem to points in the Hilbert space is selected, and that mapping is used to generate the Hamiltonian. Mapping the problem grid points to the qubits' Hilbert space is performed for the number of qubits required to encode the grid points at the selected level of density. For a given number of qubits, the Hilbert space can be spanned by a number of unit vectors, as discussed with reference to FIG. 3. Each of the nodes of the grid (the problem grid points) is mapped to one of these vectors, such that a given node will correspond with one possible state of the qubits within the system. The real-space points from the problem may be mapped into the Hilbert space to determine the matrix elements that will be nonzero in the generated Hamiltonian. Referring to FIG. 3, an example mapping of problem grid points 301 to vectors spanning the Hilbert space 302 is shown.

At 204, the boundary value problem is transformed into a problem Hamiltonian. To transform the boundary value problem into a problem Hamiltonian, the equation or equations governing the system are discretized and mathematically manipulated to take the form of a Hamiltonian equation. After discretizing the derivatives, the equations are algebraically manipulated to produce a matrix that describes the Hamiltonian. One example of this type of algebraic manipulation is provided below. The generated matrix may then be projected onto the outer products of the set of Pauli operators for each qubit, as shown in the example discussed below. The transformation of the boundary value problem into a problem Hamiltonian may include generating qubit bias and coupler values. These values may then be used to program the quantum processor based on the given relationships between the qubits and the biases applied to individual qubits.

At 205, instructions are transmitted to the quantum processor to cause the quantum processor to evolve from an initial state to a final state based on the problem Hamiltonian. Where qubit bias and coupler values are generated at 204, the processor may evolve based on the problem Hamiltonian and the qubit bias and coupler values. The processor may be evolved multiple times to generate a set of results and the results may be analyzed in terms of the probability density of the results. In some implementations the quantum processor may be evolved in a piecewise manner over a Feynman path integral from the initial state to the final state. In other implementations, the quantum processor may be evolved through quantum annealing.

At 206, the wavefunction amplitudes of the final state are measured. Measuring the wavefunction amplitudes may, for example, include performing quantum process tomography. Quantum process tomography is a technique to deduce any arbitrary quantum state that a system has achieved after having been subjected to a quantum evolution. The system is prepared into that arbitrary state and projected onto an orthonormal basis. This process must be repeated many times in order to perform all the required projections. See, for example, M. Mohseni et al., QUANTUM PROCESS TOMOGRAPHY: RESOURCE ANALYSIS OF DIFFERENT STRATEGIES, arXiv:quant-ph/0702131.

The wave function of the system is a description of the quantum state of the system. A qubit can be described by a superposition of the basis states, represented by $|\psi\rangle = \alpha|0\rangle + \beta|1\rangle$, where $\alpha$ and $\beta$ are probability amplitudes and the probability of the qubit being in state 0 is $|\alpha|^2$ and the probability of the qubit being in state 1 is $|\beta|^2$. The squared modulus of the wave function of the system, $|\psi|^2$, provides a probability density.

At 207, the wavefunction amplitudes of the final state are mapped onto the problem grid points based on the Hilbert space of the qubits. Other transformational acts, such as computing a solution value for a particular inquiry, may also be performed.

At 208, the method ends. The method may be restarted as desired or may be performed iteratively.

An example implementation of this method will now be described. For this example, we consider Helmholtz's equation in 1 dimension:

$$\partial_x^2 f + k^2 f = 0$$

where f(x) is a time-independent scalar field. One can discretize this equation as follows:

$$\frac{f(x_{i+1}) - 2f(x_i) + f(x_{i-1})}{\delta x^2} + k^2 f(x_i) = 0$$

where the index is $1 \leq i \leq N$. To turn this equation into a Hamiltonian, take the square and sum over all sites i:

$$H = \sum_{i=1}^{N} \left[ \frac{f(x_{i+1})}{\delta x^2} + \left(k^2 - \frac{2}{\delta x^2}\right) f(x_i) + \frac{f(x_{i-1})}{\delta x^2} \right]^2$$

$$H = \sum_{i=1}^{N} \left\{ \frac{[f(x_{i+1})]^2}{\delta x^4} + \frac{(k^2 \delta x^2 - 2)^2}{\delta x^4}[f(x_i)] + \frac{[f(x_{i-1})]^2}{\delta x^4} + \frac{2(k^2 \delta x^2 - 2)^2}{\delta x^4} f(x_{i+1}) \right.$$

$$\left. f(x_i) + \frac{2}{\delta x^4} f(x_{i+1}) f(x_{i-1}) + \frac{2(k^2 \delta x^2 - 2)^2}{\delta x^4} f(x_i) f(x_{i-1}) \right\}$$

The correct choice of f(x) will yield H|f($x_i$)=0 if f(x) is a continuous function. Assuming that $f(x_i) = s_i \in [\pm 1]$ and that an overall scale factor for f(x) can be absorbed into the definition of H, the ground state will provide an approximation of the desired solution. It will be understood that this example can be extended to multiple bits of precision for f(x) algebraically. With this substitution, the Hamiltonian now resembles a 2-local spin Hamiltonian with nearest-neighbour and next-nearest-neighbour interactions:

$$H = \sum_{i=1}^{N} \left\{ \frac{[s_{i+1}]^2}{\delta x^4} \frac{(k^2 \delta x^2 - 2)^2}{\delta x^4}[s_i]^2 + \frac{[s_{i-1}]^2}{\delta x^4} + \right.$$

$$\left. \frac{2(k^2 \delta x^2 - 2)}{\delta x^4} s_{i+1} s_i + \frac{2}{\delta x^4} s_{i+1} s_{i-1} + \frac{2(k^2 \delta x^2 - 2)^2}{\delta x^4} s_i s_{i-1} \right\}$$

This can be simplified further, for the number of bits of precision in this example, to:

$$H = \sum_{i=1}^{N} [a s_{i+1} s_i + b s_{i+1} s_{i-1} + a s_i s_{i-1}]$$

Each site i is encoded to a point in Hilbert space for the given system, and the amplitude of the wave function for that point will correspond to $s_i$. For example, FIG. 3 demonstrates a system of 3 qubits with a lattice containing N=8 sites encoded onto the system of 3 qubits. The Hamiltonian may then be written in matrix form as:

$$H = \begin{bmatrix} 0 & a/2 & b/2 & 0 & \cdots & 0 \\ a/2 & 0 & a/2 & b/2 & \cdots & 0 \\ b/2 & a/2 & 0 & a/2 & \cdots & 0 \\ \vdots & \vdots & \vdots & \vdots & \ddots & \vdots \\ 0 & 0 & 0 & 0 & \cdots & 0 \end{bmatrix}$$

The Hamiltonian can be expressed in terms of Pauli matrices I, X, Y, and Z as:

$$H = \frac{a}{2}\left[IIX + \frac{1}{2}IXX - \frac{1}{2}IYY + \frac{1}{4}XXX + \frac{1}{4}XYY - \frac{1}{4}YXY\right] + \frac{b}{2}\left[IXI + \frac{1}{2}XXI - \frac{1}{2}YYI\right]$$

Referring to FIG. 3, for this example, the a and b interactions (nearest-neighbor and next-nearest-neighbor) are shown at 303 and 304 respectively. These a and b values may, for example, be set by varying coupler parameters to influence the coupling between qubits, as well as the individual tuning of each qubit. In the example implementation of FIG. 3, a line of 8 points has been compressed into a system of 3 qubits. By making use of the Hilbert space of the qubits, the number of points in the problem grid that can be accommodated will increase exponentially with the number of qubits. For example, 100 qubits may be used to represent $2^{100} \sim 10^{30}$ points. This allows the qubit system to encode a problem within quantum memory, by storing quantum states within a register of qubits, without the requirement to provide one qubit for every point within the problem grid.

The processor can then be evolved based on the problem Hamiltonian and resulting wave functions may be extracted. In some implementations, process tomography may be performed to measure the amplitude in order to extract the solution.

Figure 4:
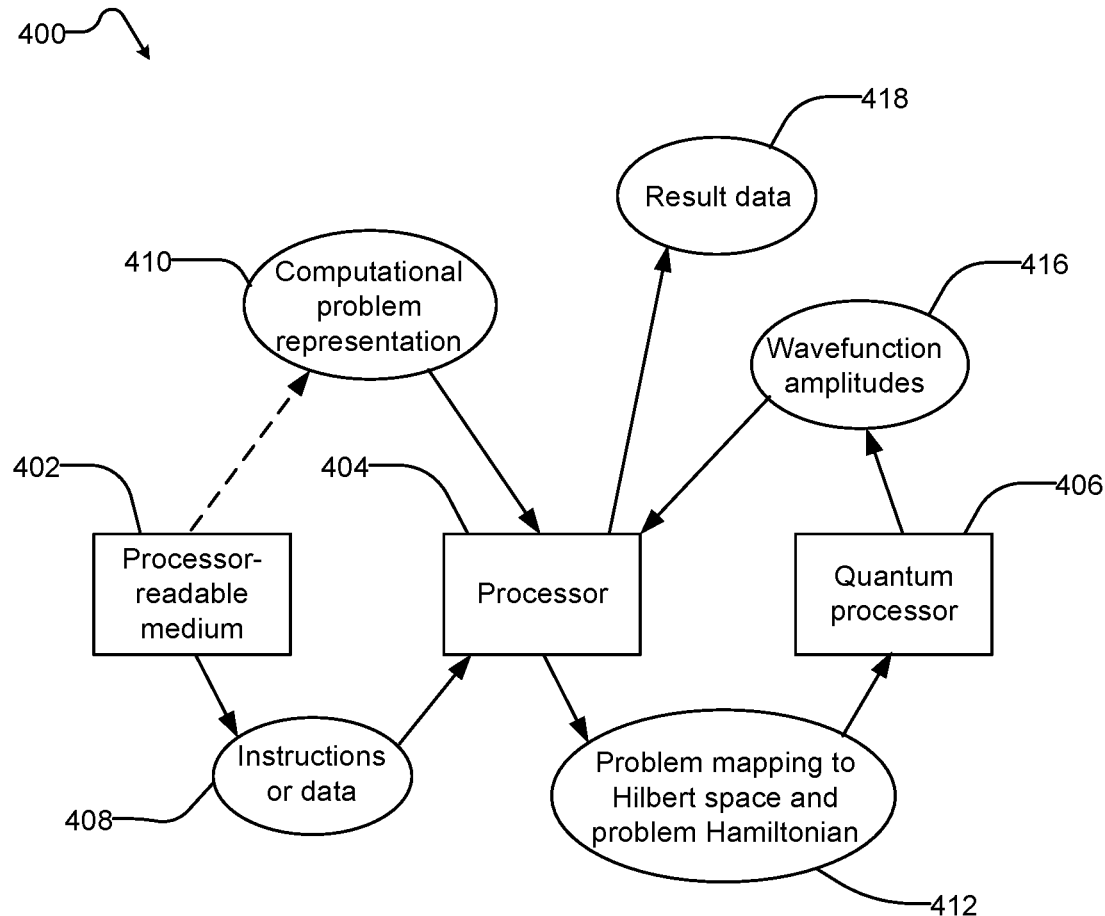
FIG. 4 is a schematic diagram illustrating a representative computing system, with flow between the portions of the computing system during the methods described herein illustrated.

Referring to FIG. 4, a system for implementing finite element modeling on a quantum processor 400 is depicted. System 400 has at least one non-transitory processor-readable medium 402 that stores at least one of processor executable instructions or data 408, and at least one processor 404 communicatively coupled to the least one non-transitory processor-readable medium 402 and a quantum processor 406. Quantum processor 406 will contain programmable elements as discussed above, including multiple qubits. Processor 404, in response to execution of at least one of processor executable instructions or data 408, receives a representation of a computational problem 410. Computational problem 410 will include a boundary value problem and problem grid points. Computational problem 410 may be transmitted by processor readable medium 402 or may be provided directly to processor 404 by a user or another processor.

Processor 404 maps the problem grid points to a Hilbert space of the qubits and transforms the boundary value problem into a problem Hamiltonian at 412, which may include providing qubit bias and coupler values as discussed above. Processor 404 transmits instructions to quantum processor 406 to cause quantum processor 406 to evolve from an initial state to a final state based on the problem Hamiltonian 412. Quantum processor 406 may also evolve based on the qubit bias and coupler values as discussed above. Evolution of the quantum processor may be performed, for example, piecewise over a Feynman path integral or by performing quantum annealing. Resulting wavefunction amplitudes of the final state are measured over the Hilbert space of the qubits and are provided at 416 to processor 404. Measurement of the wavefunction amplitudes may, for example, be performed using quantum process tomography. Processor 404 maps the wavefunction amplitudes of the final state onto the problem grid points from 412 to transform the problem back to the original form to provide result data at 418.

As discussed above, the systems and methods described herein may beneficially allow for finite element modelling to be implemented on a quantum processor having a number of qubits that is significantly smaller than the number of problem grid points that may be desired or required to perform finite element modelling effectively or accurately. Considering all of the possible states of the qubits and assigning problem grid points to vectors defining these possible states may allow for significantly finer grids to be implemented on quantum processors in comparison with assigning problem grid points directly to qubits. This may beneficially allow for solution of complex problems by finite element modelling, relying on the concept of quantum memory.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos.

7,533,068, 7,876,248, 8,008,942, 8,035,540, 8,098,179, 8,190,548, 8,195,596, and 8,421,053, and U.S. Patent Application No. 63/000,052.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method of operation of a hybrid computing system comprising a digital processor and a quantum processor, the quantum processor comprising qubits, the method being performed by the digital processor, the method implementing a finite element model, the method comprising:

receiving a representation of a computational problem, the computational problem comprising a boundary value problem and problem grid points;

mapping the problem grid points to a Hilbert space of the qubits;

transforming the boundary value problem into a problem Hamiltonian;

causing the quantum processor to evolve from an initial state to a final state based on the problem Hamiltonian;

measuring the wavefunction amplitudes of the final state; and mapping the wavefunction amplitudes of the final state onto the problem grid points based on the Hilbert space of the qubits.

2. The method of claim 1, wherein transforming the boundary value problem into a problem Hamiltonian comprises generating qubit bias and coupler values.

3. The method of claim 2, wherein causing the quantum processor to evolve from an initial state to a final state based on the problem Hamiltonian further comprises causing the quantum processor to evolve from an initial state to a final state based on the problem Hamiltonian and the qubit bias and coupler values.

4. The method of claim 1, wherein measuring the wavefunction amplitudes of the final state comprises performing quantum process tomography.

5. The method of claim 1, wherein causing the quantum processor to evolve from an initial state to a final state based on the problem Hamiltonian comprises causing the quantum processor to evolve piecewise over a Feynman path integral from the initial state to the final state.

6. The method of claim 1, wherein causing the quantum processor to evolve from an initial state to a final state based on the problem Hamiltonian comprises causing the quantum processor to evolve through quantum annealing from an initial Hamiltonian to the problem Hamiltonian.

7. The method of claim 1, wherein mapping the problem grid points to a Hilbert space of the qubits comprises:

determining all possible states of the qubits;

defining a set of vectors, wherein each vector in the set of vectors represents one of the possible states of the qubits; and assigning each of the problem grid points to one of the vectors in the set of vectors.

8. A hybrid computing system for implementing finite element modeling on a quantum processor, comprising:

a quantum processor comprising qubits;

at least one non-transitory processor-readable medium that stores at least one of processor executable instructions and data; and at least one digital processor communicatively coupled to the least one non-transitory processor-readable medium and the quantum processor, wherein the at least one digital processor, in response to execution of the at least one of processor executable instructions and data:

receives a representation of a computational problem, the computational problem comprising a boundary value problem and problem grid points;

maps the problem grid points to a Hilbert space of the qubits;

transforms the boundary value problem into a problem Hamiltonian;

causes the quantum processor to evolve from an initial state to a final state based on the problem Hamiltonian;

measures the wavefunction amplitudes of the final state over the Hilbert space of the qubits; and maps the wavefunction amplitudes of the final state onto the problem grid points based on the Hilbert space of the qubits.

9. The system of claim 8, wherein the at least one digital processor transforms the boundary value problem into a problem Hamiltonian and generates qubit bias and coupler values.

10. The system of claim 9, wherein the at least one digital processor causes the quantum processor to evolve from an initial state to a final state based on the problem Hamiltonian and the qubit bias and coupler values.

11. The system of claim 8, wherein the at least one digital processor measures the wavefunction amplitudes of the final state using quantum process tomography.

12. The system of claim 8, wherein the at least one digital processor causes the quantum processor to evolve from an initial state to a final state based on the problem Hamiltonian by evolving piecewise over a Feynman path integral from the initial state to the final state.

13. The system of claim 8, wherein the at least one digital processor causes the quantum processor to evolve from an initial state to a final state based on the problem Hamiltonian by performing quantum annealing from an initial Hamiltonian to the problem Hamiltonian.

14. The system of claim 8, wherein to map the problem grid points to a Hilbert space of the qubits the at least one digital processor:

determines all possible states of the qubits;

defines a set of vectors, wherein each vector in the set of vectors represents one of the possible states of the qubits; and assigns each of the problem grid points to one of the vectors in the set of vectors.

* * * * *